(12) United States Patent
Jo et al.

(10) Patent No.: US 10,809,833 B2
(45) Date of Patent: Oct. 20, 2020

(54) FINGERPRINT SENSOR, TOUCH SENSOR HAVING FINGERPRINT SENSOR, AND DISPLAY DEVICE HAVING TOUCH SENSOR

(71) Applicant: Samsung Display Co., Ltd., Yongin-Si, Gyeonggi-Do (KR)

(72) Inventors: Yong Won Jo, Yongin-si (KR); Su Yul Seo, Yongin-si (KR); Yu Jin Choi, Yongin-si (KR); Sung Sik Yun, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/162,325

(22) Filed: Oct. 16, 2018

(65) Prior Publication Data

US 2019/0204969 A1 Jul. 4, 2019

(30) Foreign Application Priority Data

Jan. 2, 2018 (KR) ........................ 10-2018-0000150

(51) Int. Cl.
*G06F 3/044* (2006.01)
*G06F 3/041* (2006.01)
(Continued)

(52) U.S. Cl.
CPC ............ *G06F 3/0412* (2013.01); *G06F 3/044* (2013.01); *G06F 3/0443* (2019.05); *G06F 3/0446* (2019.05); *G06K 9/0002* (2013.01); *H01L 27/3258* (2013.01); *H01L 27/323* (2013.01); *H01L 51/5253* (2013.01)

(58) Field of Classification Search
CPC ...... G06F 3/044; G06F 3/0412; G06F 3/0418; G06F 2203/04107; G06F 3/0414; G06F 1/1637; G06F 1/1641; G06F 1/1643; G06F 21/32; G06F 3/0488; G06F 2203/04106; G06F 2203/04104; G06F 2203/04103; G06F 3/047; G06F 2203/04111; G06F 3/0446; G06F 3/0443; H01L 27/3258;
(Continued)

(56) References Cited

U.S. PATENT DOCUMENTS 6,357,302 B1 * 3/2002 Knapp ............... G06K 9/00053
73/862.626
6,370,965 B1 * 4/2002 Knapp ............... G06K 9/00053
73/780
(Continued)

FOREIGN PATENT DOCUMENTS

KR 10-2017-0026537 A 3/2017
KR 10-2017-0033125 A 3/2017

*Primary Examiner* — Duc Q Dinh
(74) *Attorney, Agent, or Firm* — Innovation Counsel LLP

(57) ABSTRACT

A fingerprint sensor includes: a plurality of sensing electrodes provided on one surface of a base substrate, the plurality of sensing electrodes being arranged in a matrix form; and a ground electrode provided on the other surface of the base substrate. The ground electrode includes: a plurality of first lines extending in one direction, the plurality of first lines being parallel to one another; and a plurality of second lines extending in a direction intersecting the first lines, the plurality of second lines being parallel to one another. In a plan view, the first lines and the second lines are provided between adjacent sensing electrodes.

16 Claims, 8 Drawing Sheets

(51) Int. Cl.
*H01L 27/32* (2006.01)
*G06K 9/00* (2006.01)
*H01L 51/52* (2006.01)

(58) Field of Classification Search
CPC .. H01L 51/5253; H01L 27/323; G06K 9/0002
USPC .................................................. 345/173–175
See application file for complete search history.

(56) References Cited

U.S. PATENT DOCUMENTS

| | | | |
|---|---|---|---|
| 9,507,479 B2* | 11/2016 | Minami | G06F 3/044 |
| 9,710,689 B2 | 7/2017 | Evans et al. | |
| 9,772,734 B2* | 9/2017 | Lee | G06F 3/044 |
| 10,055,058 B2* | 8/2018 | Kimura | G02F 1/134309 |
| 2005/0226476 A1* | 10/2005 | Funahashi | G06K 9/00114 |
| | | | 382/124 |
| 2015/0268776 A1* | 9/2015 | Ishizaki | G06F 3/0412 |
| | | | 345/174 |
| 2016/0055363 A1 | 2/2016 | Lee et al. | |
| 2016/0306475 A1* | 10/2016 | Cho | G06F 3/044 |
| 2017/0061189 A1* | 3/2017 | Kwon, II | G06K 9/0002 |
| 2017/0076131 A1 | 3/2017 | Jeong et al. | |
| 2017/0140195 A1 | 5/2017 | Wang et al. | |

* cited by examiner

FINGERPRINT SENSOR, TOUCH SENSOR HAVING FINGERPRINT SENSOR, AND DISPLAY DEVICE HAVING TOUCH SENSOR

CROSS-REFERENCE TO RELATED APPLICATION

The present application claims priority under 35 U.S.C. § 119(a) to Korean patent application 10-2018-0000150 filed on Jan. 2, 2018 in the Korean Intellectual Property Office, the entire disclosure of which is incorporated herein by reference.

BACKGROUND

1. Technical Field

An aspect of the present disclosure relates to a fingerprint sensor, a touch sensor having the fingerprint sensor, and a display device having the touch sensor.

2. Related Art

Display devices including a touch sensor attached to or integrated with a display panel have been developed. The touch sensor functions as an information input device. A user may input information by pressing or touching the touch sensor while viewing an image provided on the display panel.

Meanwhile, the touch sensor including a fingerprint recognition function have been developed. Display devices capable of identifying personal information or maintaining security can thus be provided.

SUMMARY

Embodiments provide a fingerprint sensor having improved fingerprint sensing performance.

Embodiments also provide a touch sensor having the fingerprint sensor.

Embodiments also provide a display device having the touch sensor.

According to an aspect of the present disclosure, there is provided a fingerprint sensor including: a plurality of sensing electrodes provided on one surface of a base substrate, the plurality of sensing electrodes being arranged in a matrix form; and a ground electrode provided on the other surface of the base substrate, wherein the ground electrode includes: a plurality of first lines extending in one direction, the plurality of first lines being parallel to one another; and a plurality of second lines extending in a direction intersecting the first lines, the plurality of second lines being parallel to one another, wherein, in a plan view, the first lines and the second lines are provided between adjacent sensing electrodes.

In a plan view, the sensing electrodes may be respectively provided in regions formed by the first lines and the second lines intersecting with each other.

The fingerprint sensor may further include a protective layer covering the ground electrode.

The other surface of the base substrate may face a direction for receiving a fingerprint of user.

According to an aspect of the present disclosure, there is provided a touch sensor including: a plurality of touch electrodes provided on one surface of a base substrate; and a ground electrode provided on the other surface of the base substrate, corresponding to one of the touch electrodes, the ground electrode including a plurality of first lines and a plurality of second lines, which intersect each other, wherein a touch electrode corresponding to the ground electrode includes a plurality of sensing electrodes arranged in a matrix form, wherein, in a plan view, the first lines and the second lines are provided between adjacent sensing electrodes.

According to an aspect of the present disclosure, there is provided a display device including: a display panel; and a touch sensor provided on the display panel, wherein the touch sensor includes: a plurality of touch electrodes provided on the display panel; a first protective layer provided over the touch electrodes; and a ground electrode provided on the first protective layer, corresponding to one of the touch electrodes, the ground electrode including a plurality of first lines and a plurality of second lines, which intersect each other, wherein a touch electrode corresponding to the ground electrode includes a plurality of sensing electrodes arranged in a matrix form, wherein, in a plan view, the first lines and the second lines are provided between adjacent sensing electrodes.

The display panel may include: a display element provided on a substrate; and an encapsulation layer covering the display element. The touch electrodes and the sensing electrodes may be provided on the encapsulation layer.

The display device may further include a second protective layer covering the ground electrode.

The first protective layer may be a window cover of the display device, and the second protective layer may be a hard coating layer protecting a surface of the display device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
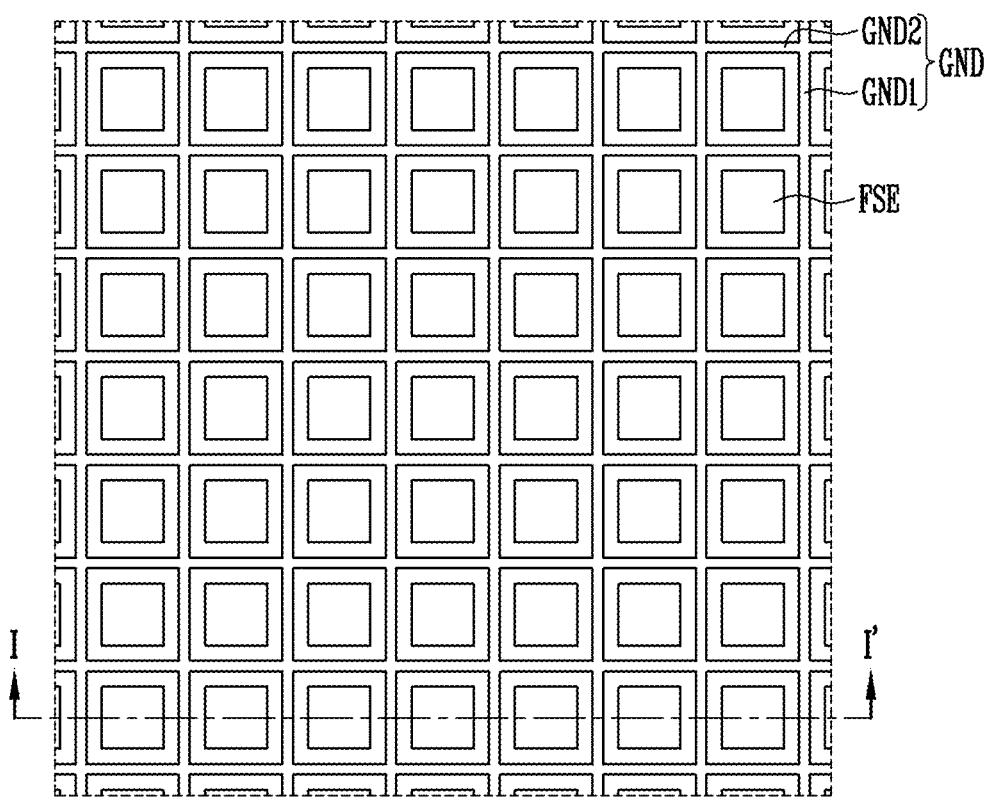
FIG. 1 is a plan view illustrating a fingerprint sensor according to an embodiment of the present disclosure.

A detailed description of one or more embodiments of the present disclosure is provided below along with accompanying figures that illustrate the principles of the present disclosure. The present disclosure is described in connection with such embodiments, but the present disclosure is not limited to any embodiment. It is understood that various changes can be applied to the embodiments described herein. The embodiments illustrated herein are examples only. For example, different shapes can be used, the material described herein can change or equivalent material or replacement can be used. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

Figure 2:
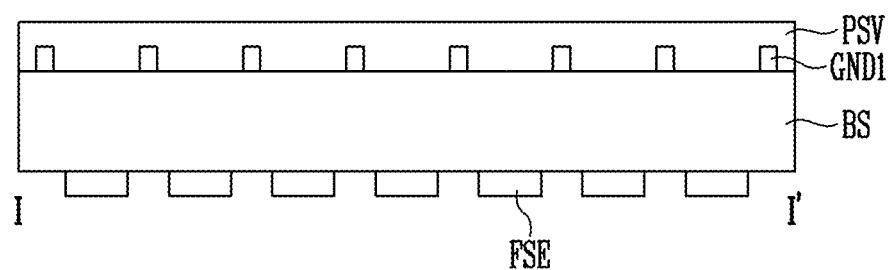
FIG. 2 is a sectional view taken along line I-I' of FIG. 1.

FIG. 1 is a plan view illustrating a fingerprint sensor according to an embodiment of the present disclosure. FIG. 2 is a sectional view taken along line I-I' of FIG. 1.

Referring to FIGS. 1 and 2, the fingerprint sensor may include a base substrate BS, a plurality of sensing electrodes FSE provided on one surface of the base substrate BS, and a ground electrode GND provided on the other surface of the base substrate BS. In addition, the ground electrode GND may be covered with a protective layer PSV.

The base substrate BS may include a transparent insulating material to enable light to be transmitted therethrough. The base substrate BS may be a rigid substrate or a flexible substrate. The rigid substrate may include a glass substrate, a quartz substrate, a glass ceramic substrate, and a crystalline glass substrate. The flexible substrate may include a film substrate and a plastic substrate, which include a polymer organic material. For example, the flexible substrate may include one of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Also, the flexible substrate may include fiber glass reinforced plastic (FRP).

The fingerprint sensor may be an active self-capacitance (ASC) type fingerprint sensor. For example, the sensing electrodes FSE may be arranged in a matrix form. Also, the sensing electrodes FSE may be connected to pads (not shown) through lines (not shown), respectively.

The sensing electrodes FSE may include a transparent conductive oxide. For example, the sensing electrodes FSE may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

Also, the sensing electrodes FSE may be formed as a two-dimensional array of sensing electrodes. For example, the sensing electrodes FSE may be configured in the form of a mesh in which conductive lines intersect each other.

The ground electrode GND may be provided on the other surface of the base substrate BS, e.g., the surface in a direction for receiving a fingerprint of a user. The ground electrode GND may include a plurality of first lines GND1 that extend in one direction and are parallel to one another and a plurality of second lines GND2 that extend in a direction intersecting the first lines GND1 and are parallel to one another. That is, the ground electrode GND may have a mesh structure. In addition, in a plan view, the first lines GND1 and the second lines GND2 may be provided between adjacent sensing electrodes FSE. That is, in a plan view, the sensing electrodes FSE may be respectively provided in regions formed as the first lines GND1 and the second GND2 intersect each other.

The protective layer convers the ground electrode GND, to protect the ground electrode GND. For example, the protective layer PSV may include at least one of an organic insulating layer and an inorganic insulating layer. The organic insulating layer may include at least one of acryl, polyimide (PI), polyamide (PA), and benzocyclobutene (BCB). The inorganic insulating layer may include at least one of a silicon oxide layer, a silicon nitride layer, and a silicon oxynitride layer. Also, the protective layer PSV may have a structure in which inorganic and organic insulating layers are alternately stacked.

In an embodiment of the present disclosure, the fingerprint sensor may sense a fingerprint of the user by sensing a change in capacitance of the sensing electrodes FSE.

In more detail, a finger of the user may be divided into ridge regions that are protrusion regions and valley regions between the ridge regions.

The fingerprint sensor may sense the fingerprint of the user, using a difference between a first capacitance of a first capacitor formed between the sensing electrodes FSE and the ridge regions and a second capacitance of a second capacitor formed between the sensing electrodes FSE and the valley regions.

A capacitor consists of two conductive electrodes separated by a non-conductive region. The capacitance of a capacitor is inversely proportional to the distance between two electrodes and is directly proportional to the area at which the two electrodes overlap each other. To form a capacitor between a finger of a user and the fingerprint sensor, the sensing electrodes FSE forms one of the capacitor's electrodes, and the ridge regions or the valley regions of the finger form the other one of the capacitor's electrode.

The distance between the sensing electrodes FSE and the ridge regions may be smaller than that between the sensing electrode FSE and the valley regions. Therefore, the first capacitance may be larger than the second capacitance.

Since the first capacitance and the second capacitance are inversely proportional to the distance between the two electrodes, the first capacitance and the second capacitance may decrease as the thickness of the base substrate BS increases. In addition, as the thickness of the base substrate BS increases, the decrement of the first capacitance may be larger than that of the second capacitance. Therefore, as the thickness of the base substrate BS increases, the difference between the first capacitance and the second capacitance may decrease. In addition, if an electric field distribution in the first capacitor and the second capacitor is uneven, the difference between the first capacitance and the second capacitance may decrease. If the difference between the first capacitance and the second capacitance decreases, a blur phenomenon may occur, in which the difference between a peak and a valley of a sensing signal obtained as the fingerprint sensor senses a ridge region and a valley region of the finger of the user decreases.

The ground electrode GND may prevent an electric field from being distorted between the sensing electrode FSE and the ridge regions and between the sensing electrodes FSE and the valley regions. Thus, according to the embodiment of the present disclosure, as the fingerprint sensor includes the ground electrode GND, to reduce the blur phenomenon, and the fingerprint sensing performance of the fingerprint sensor can be improved.

Figure 3:
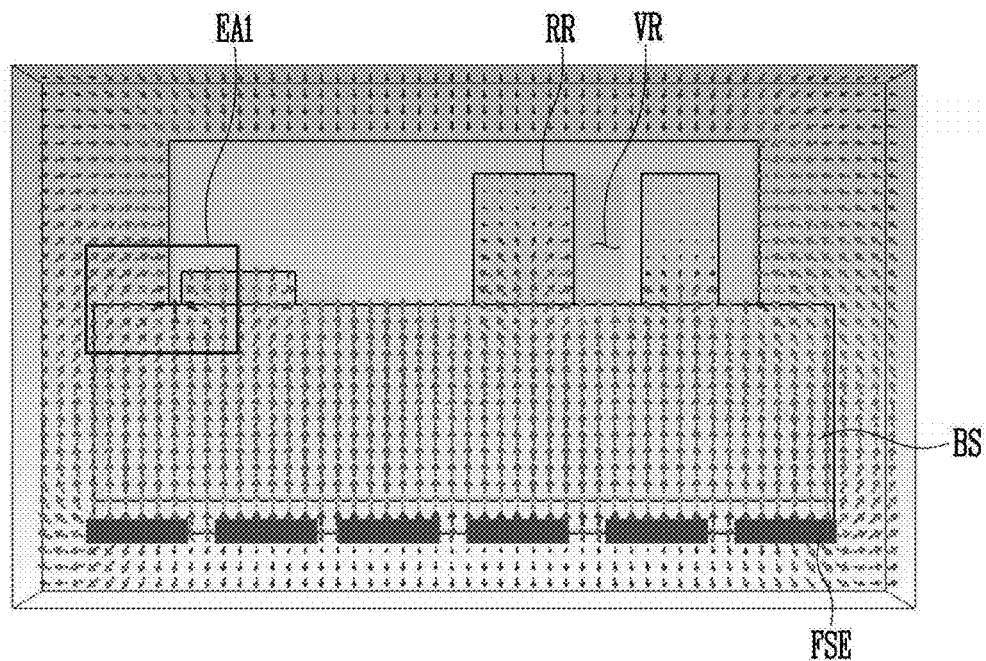
FIG. 3 is a view illustrating an electric field when the fingerprint sensor does not include any ground electrode.
Figure 4:
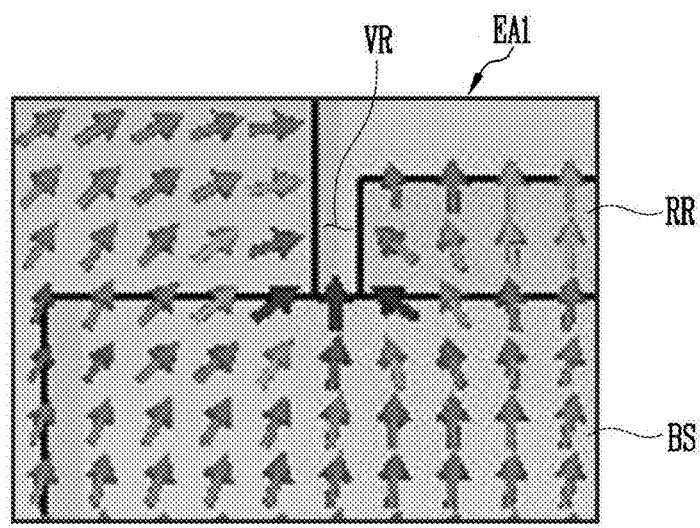
FIG. 4 is an enlarged view of region EA1 of FIG. 3.
Figure 5:
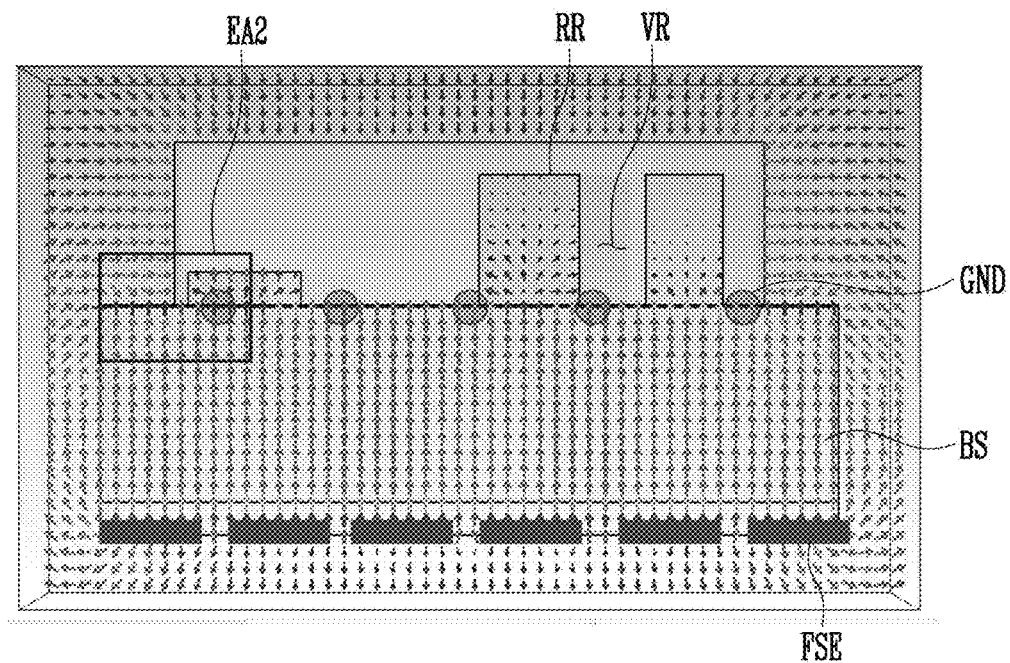
FIG. 5 is a view illustrating an electric field when the fingerprint sensor includes a ground electrode.
Figure 6:
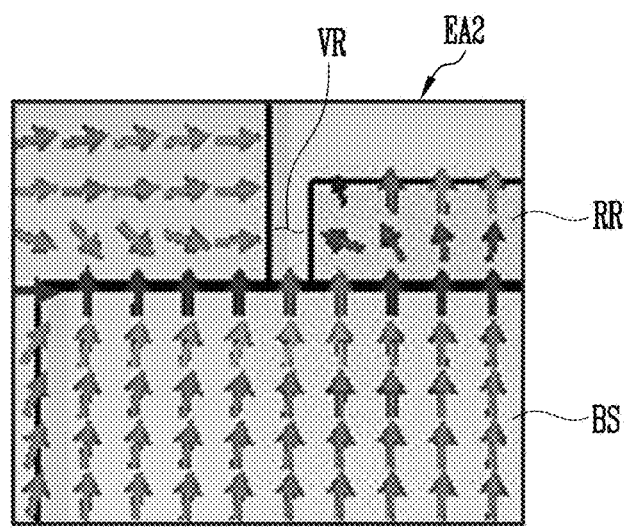
FIG. 6 is an enlarged view of region EA2 of FIG. 5.

FIG. 3 is a view illustrating an electric field when the fingerprint sensor does not include any ground electrode. FIG. 4 is an enlarged view of region EA1 of FIG. 3, and FIG. 5 is a view illustrating an electric field when the fingerprint sensor includes a ground electrode. FIG. 6 is an enlarged view of region EA2 of FIG. 5.

First, as shown in FIGS. 3 and 4, in a fingerprint sensor including no ground electrode, electric force lines constituting an electric field may be modified in a region between the ridge regions and the valley regions of the fingerprints. When the electric force lines are modified, a blur phenomenon of a signal obtained as the fingerprint sensor senses a ridge region RR and a valley region VR of a finger of a user may occur. If the blur phenomenon occurs, the difference between a peak and a valley of a detection signal obtained as the fingerprint sensor detects a fingerprint of the user may decrease. Therefore, the fingerprint sensing performance of the fingerprint sensor may be deteriorated.

Meanwhile, as shown in FIGS. 5 and 6, it may be seen that, in a fingerprint sensor including a ground electrode GND, electric force lines constituting an electric field are only slightly modified in a region between the ridge regions and the valley regions of the fingerprints. If the modification of the electric force lines decreases, a blur phenomenon of a signal obtained as the fingerprint sensor senses a ridge region RR and a valley region VR of a finger of a user may be reduced. If the blur phenomenon is reduced, the difference between a peak and a valley of a detection signal obtained as the fingerprint sensor detects a fingerprint of the user may increase. Thus, the fingerprint sensing performance of the fingerprint sensor may be improved.

The following Tables 1 to 3 are tables illustrating capacitance detected from each sensing electrode for different thicknesses of the base substrate and different configurations of the fingerprint sensor.

TABLE 1

Measurement of capacitance when thickness of base substrate is 0.1 mm

|  | Experimental Example 1 | Experimental Example 2 | Experimental Example 3 |
| --- | --- | --- | --- |
| Cmin (fF) | 2.94 | 5.38 | 0.79 |
| Cmax (fF) | 6.38 | 6.30 | 5.37 |
| ΔC (fF) | 3.45 | 0.93 | 4.58 |

TABLE 2

Measurement of capacitance when thickness of base substrate is 0.2 mm

|  | Experimental Example 4 | Experimental Example 5 | Experimental Example 6 |
| --- | --- | --- | --- |
| Cmin (fF) | 2.94 | 3.91 | 1.14 |
| Cmax (fF) | 4.27 | 4.25 | 3.54 |
| ΔC (fF) | 1.33 | 0.34 | 2.40 |

TABLE 3

Measurement of capacitance when thickness of base substrate is 0.3 mm

|  | Experimental Example 7 | Experimental Example 8 | Experimental Example 9 |
| --- | --- | --- | --- |
| Cmin (fF) | 2.60 | 3.05 | 1.21 |
| Cmax (fF) | 3.20 | 3.20 | 2.56 |
| ΔC (fF) | 0.60 | 0.15 | 1.35 |

In Tables 1 to 3, Cmin is a second capacitance formed between the valley region of the finger of the user and the sensing electrode, Cmax is a first capacitance formed between the ridge region of the finger of the user and the sensing electrode, and ΔC is a difference between the first capacitance and the second capacitance.

In addition, Experimental Examples 1, 4, and 7 represents values obtained using a fingerprint sensor including no ground electrode to measure capacitance values. Experimental Examples 2, 5, and 8 represent values obtained using a fingerprint sensor including a ground electrode that is not grounded to measure capacitance values. That is, the fingerprint sensor of Experimental Examples 2, 5, and 8 includes a ground electrode in a floating state. Experimental Examples 3, 6, and 9 represent values obtained using a fingerprint sensor including a ground electrode that is grounded to measure capacitance values.

Referring to Tables 1 to 3, it may be seen that, regardless of whether the fingerprint sensor includes a ground electrode, ΔC decreases as the thickness of the base substrate increases. Thus, the blur phenomenon may be prevented as the thickness of the base substrate decreases, and the sensitivity of the fingerprint sensor may be improved as the thickness of the base substrate decreases.

Meanwhile, it may be seen that, under a condition that the base substrate has the same thickness, the fingerprint sensor including the ground electrode in the floating state has the smallest ΔC and the fingerprint sensor including the ground electrode that is grounded has the largest ΔC. That is, the blur phenomenon maybe increased in the fingerprint sensor including the ground electrode in the floating state, and the fingerprint sensing performance of the fingerprint sensor may be deteriorated. Therefore, the ground electrode is to be necessarily grounded so as to prevent the blur phenomenon of the fingerprint sensor.

Figure 7:
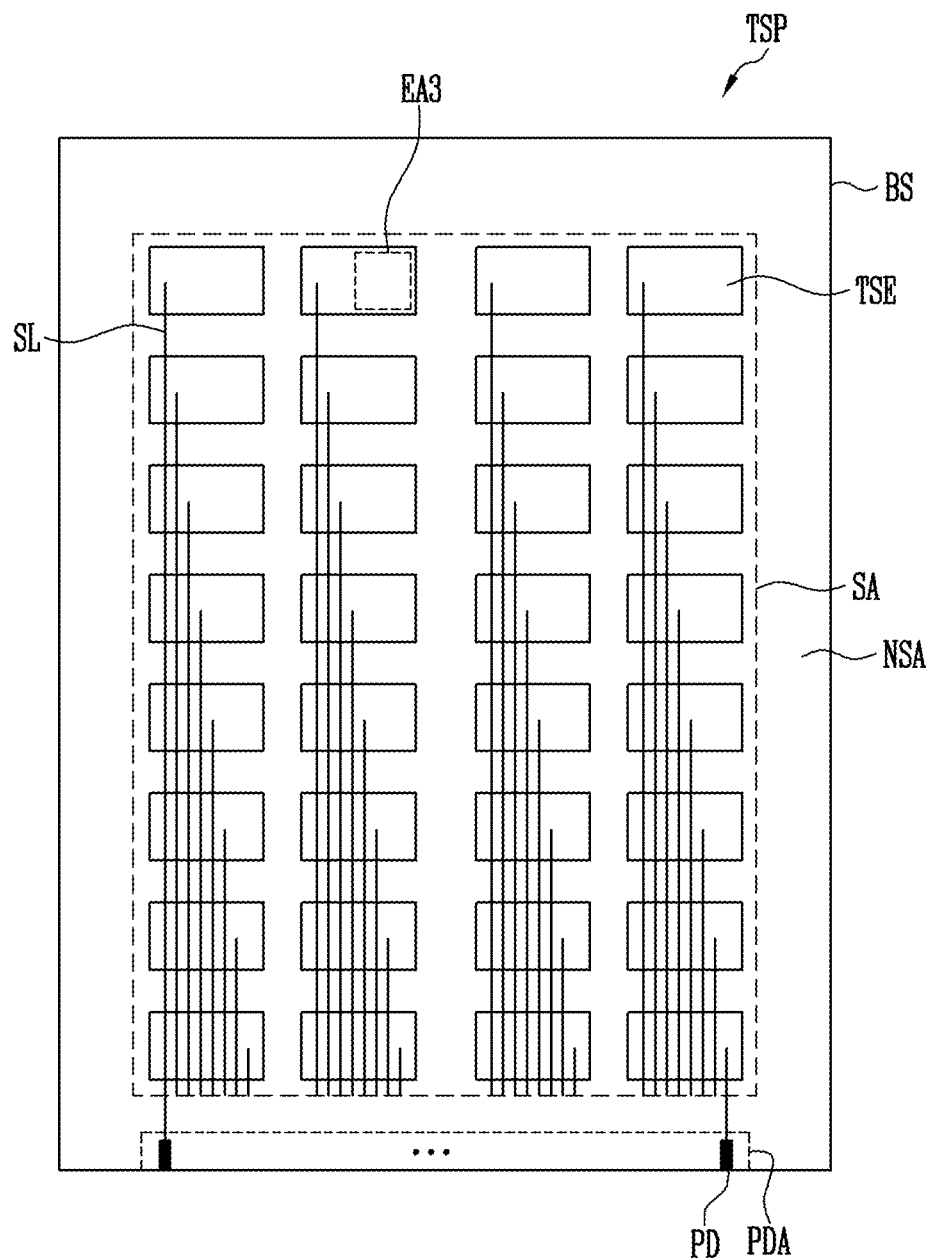
FIGS. 7 and 8 are plan views illustrating a touch sensor including the fingerprint sensor shown in FIGS. 1 and 2.
Figure 8:
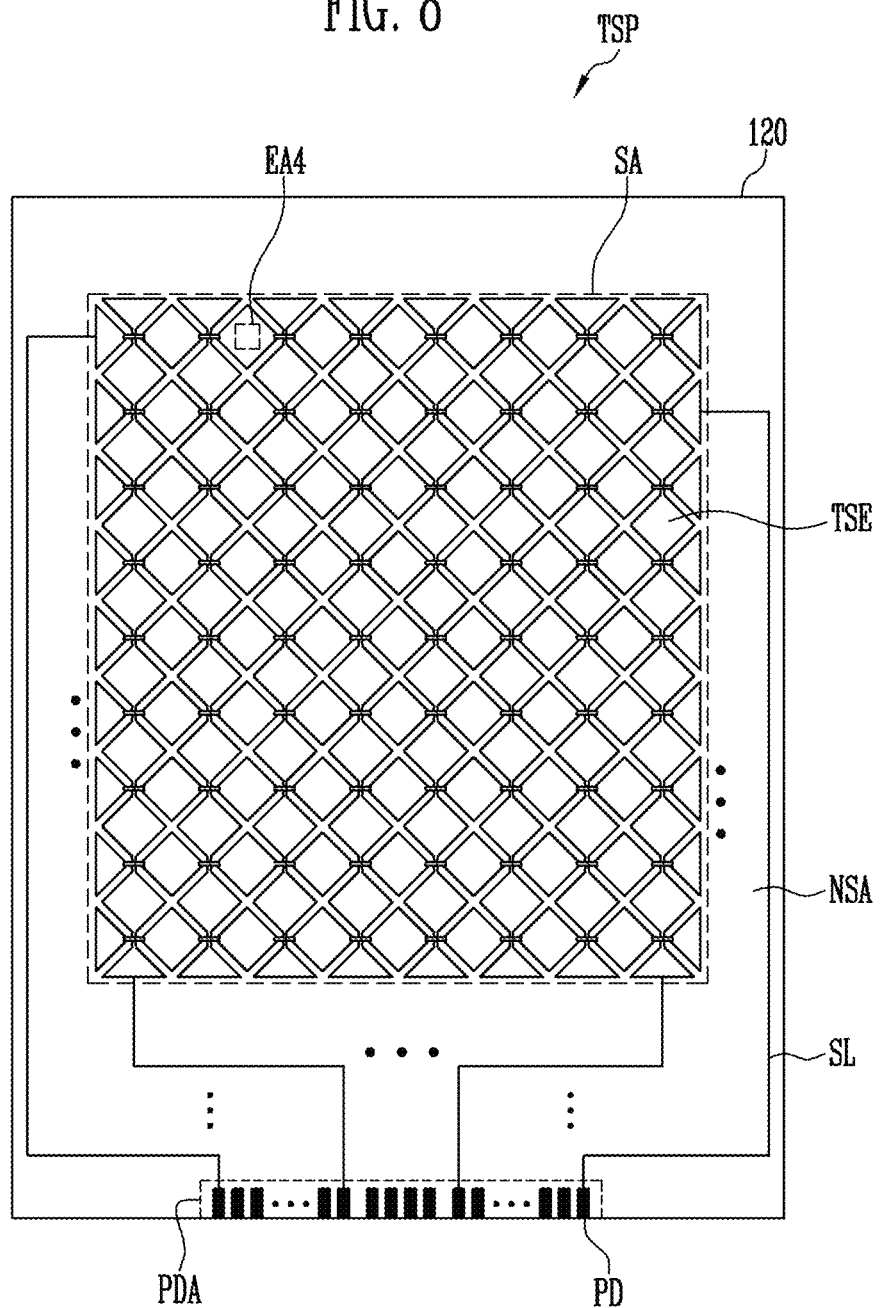
Figure 9:
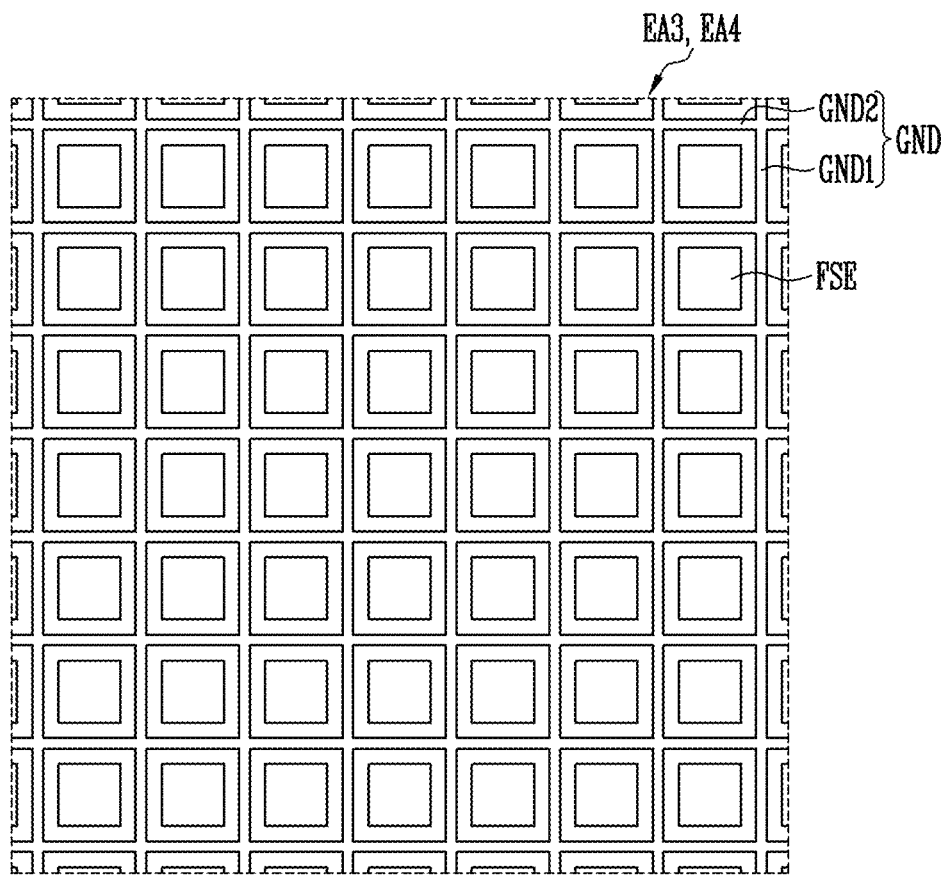
FIG. 9 is an enlarged view of regions EA3 and EA4 of FIGS. 7 and 8.

FIGS. 7 and 8 are plan views illustrating a touch sensor including the fingerprint sensor shown in FIGS. 1 and 2. FIG. 9 is an enlarged view of regions EA3 and EA4 of FIGS. 7 and 8.

Referring to FIGS. 1, 2, and 7 to 9, the touch sensor TSP may be provided on a base substrate BS, and include a sensing region SA and a non-sensing region NSA. The non-sensing region NSA may be provided adjacent to the sensing region SA. For example, the non-sensing region NSA may be provided at the periphery of the sensing region SA.

A plurality of touch electrodes TSE may be provided in the sensing region SA. The touch electrodes TSE may be connected to pads PD of a pad unit PDA through sensing lines SL.

Meanwhile, in FIG. 7, a case where the sensing lines SL overlap with the touch electrodes TSE is illustrated as an example, but the present disclosure is not limited thereto. The sensing lines SL may be provided in a region between adjacent touch electrodes TSE.

The touch electrodes TSE may be arranged in various forms according to the touch sensing form of the display device. For example, as shown in FIG. 7, the touch sensing form of the display device may be a self-capacitance touch sensor. Here, the touch electrodes TSE may be arranged in a matrix form. The touch electrodes TSE may be connected to the pads PD of the pad unit PDA through the sensing lines SL, respectively.

In addition, as shown in FIG. 8, the touch sensing form of the display device may be a mutual capacitance touch sensor. Here, some of the touch electrodes TSE may constitute a plurality of touch electrode rows that are connected in one direction and are parallel to one another. In addition, the others of the touch electrodes TSE may constitute a plurality of touch electrode columns that are connected in a direction intersecting the touch electrode rows and are parallel to one another. The touch electrode rows and the touch electrode columns may be connected to the pads PD of the pad unit PDA through the sensing lines SL, respectively.

Meanwhile, at least one of the touch electrodes TSE may sense a fingerprint of a user while sensing a touch of the user. For example, one of the touch electrodes TSE may be implemented as a fingerprint sensor. That is, the touch electrode TSE implemented as the fingerprint sensor may include a plurality of sensing electrodes FSE arranged in a matrix form. Here, the sensing electrodes FSE may be connected to some of the pads PD of the pad unit PDA through a separate line (not shown).

In addition, the touch sensor TSP may further include a ground electrode GND provided on the other surface of the base substrate BS, corresponding to the touch electrode implemented as the fingerprint sensor. The ground electrode GND may include a plurality of first lines GND1 that extend in one direction and are parallel to one another and a plurality of second lines GND2 that extend in a direction intersecting the first lines GND1 and are parallel to one another.

The ground electrode GND may prevent or reduce a blur phenomenon of the fingerprint sensor. Thus, the fingerprint sensing performance of the touch sensor TSP including the fingerprint sensor may be improved.

Meanwhile, in the embodiment of the present disclosure, a case where the touch electrode TSE implemented as the fingerprint sensor is provided at an upper end of the touch sensor TSP is illustrated as an example, but the present disclosure is not limited thereto. For example, the fingerprint sensor may be located anywhere in the touch sensor TSP.

Figure 10:
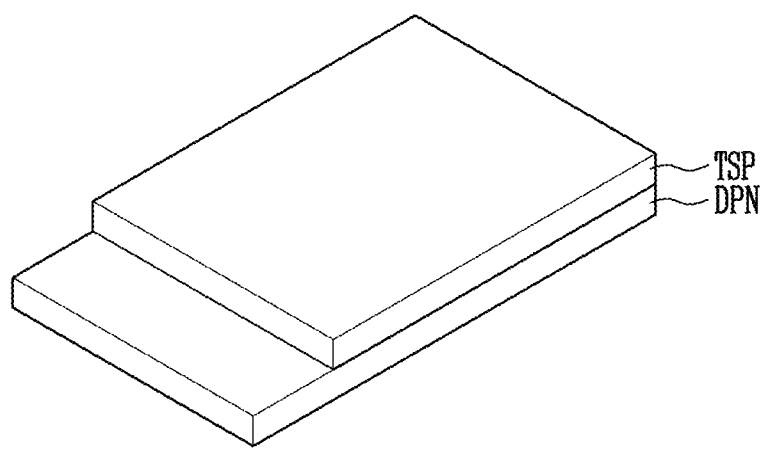
FIG. 10 is a perspective view illustrating a display device having the touch sensor of FIGS. 7 to 9.
Figure 11:
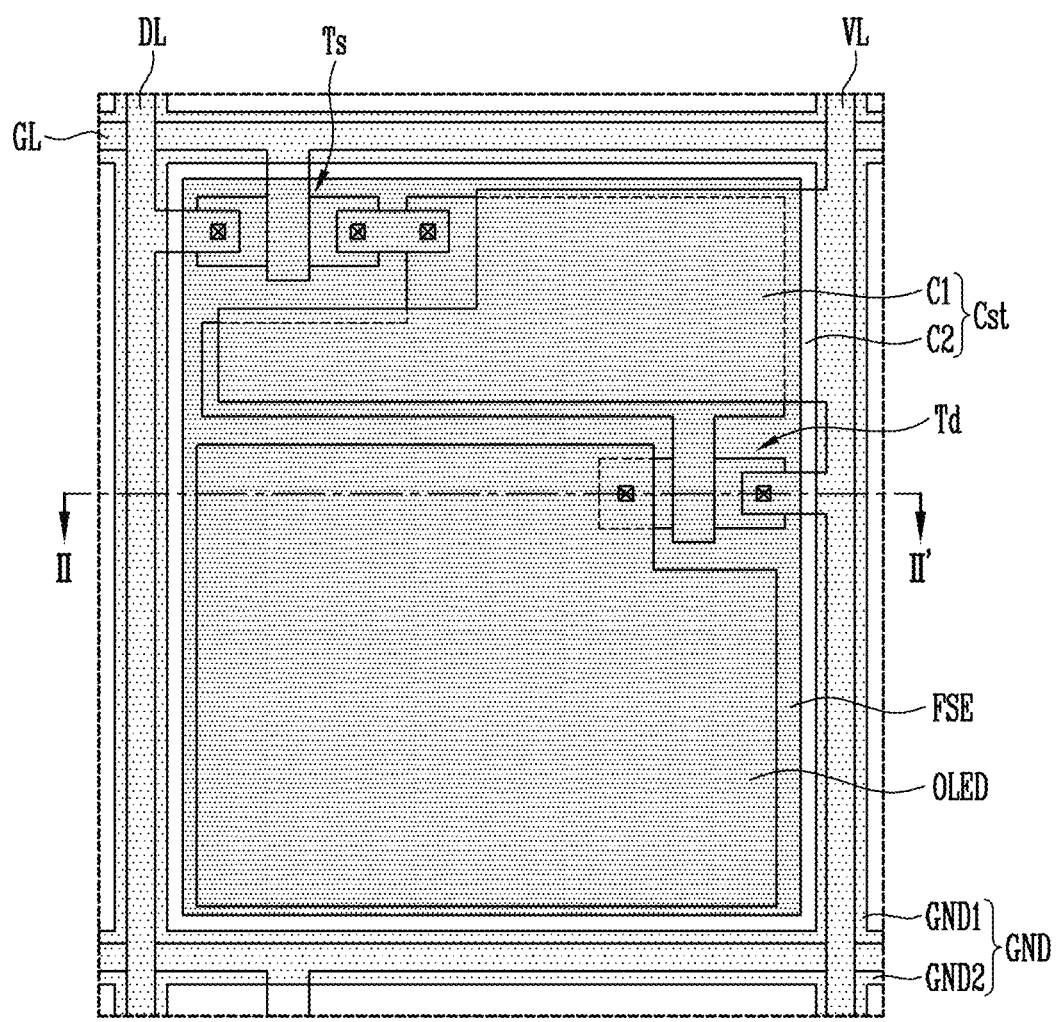
FIG. 11 is a plan view illustrating one pixel of the display device.
Figure 12:
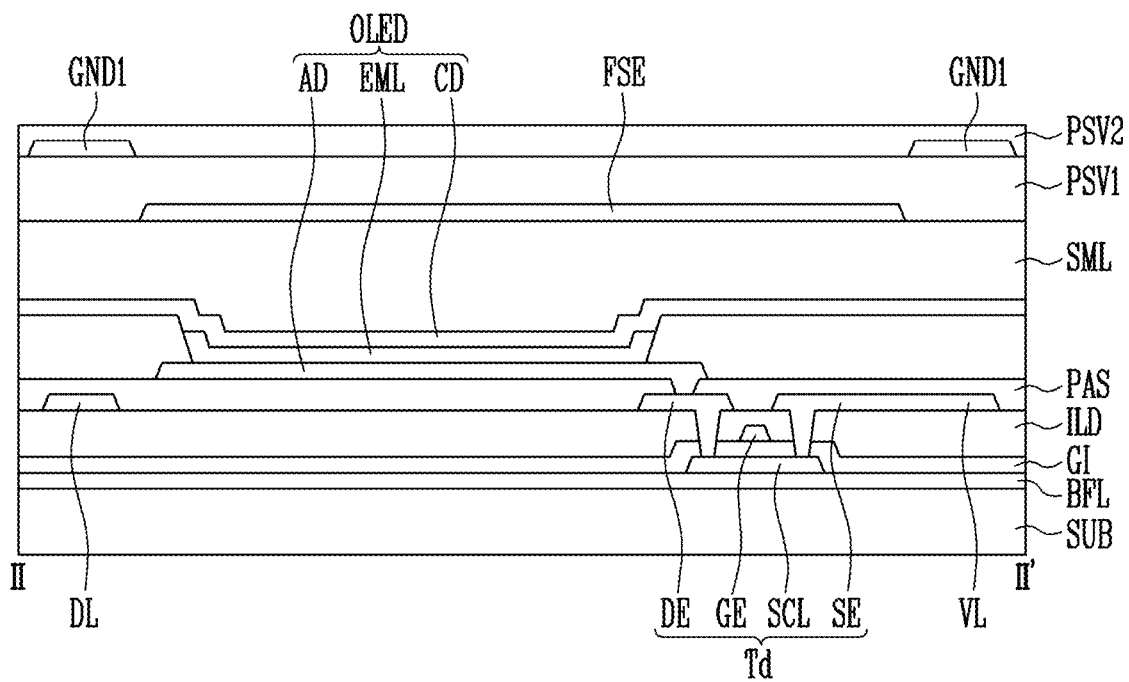
FIG. 12 is a sectional view taken along line II-II' of FIG. 11.

FIG. 10 is a perspective view illustrating a display device having the touch sensor of FIGS. 7 to 9. FIG. 11 is a plan view illustrating one pixel of the display device. FIG. 12 is a sectional view taken along line II-II' of FIG. 11.

Referring to FIGS. 7 to 12, the display device may include a display panel DPN and a touch sensor TSP.

The display panel DPN may implement an image. The display panel DPN may include a display region and a non-display region. The display region may include a plurality of pixels. The non-display region NDA may be disposed adjacent to the display region. For example, the non-display region may have a shape surrounding the display region.

The display panel DPN may include a plurality of gate lines GL provided on a substrate SUB and a plurality of data lines DL intersecting the gate lines GL, and the pixels may be connected to the gate lines GL and the data lines DL.

Each of the pixels may include a switching transistor Ts, a driving transistor Td, a capacitor Cst, and a display element OLED. The switching transistor Ts may be connected to one of the gate lines GL and one of the data lines DL, and the driving transistor Td and the capacitor Cst may be connected to a power supply line VL.

Each of the switching transistor Ts and the driving transistor Td may include a semiconductor layer SCL, a gate electrode GE insulated from the semiconductor layer SCL, and a source electrode SE and a drain electrode DE, which are connected to the semiconductor layer SCL.

Hereinafter, a stack structure of the display panel DPN will be described in more detail.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate. Also, the substrate SUB may be a flexible substrate. The substrate SUB may be one of a film substrate and a plastic substrate, which include a polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB may include a fiber reinforced plastic (FRP), etc. The material applied to the substrate SUB may be resistance (or be heat resistance) to high processing temperature in a manufacturing process of the display device.

The semiconductor layer SCL may include any one of amorphous silicon (a-Si), polycrystalline silicon (p-Si), and an oxide semiconductor. In addition, regions of the semiconductor layer SCL, which are connected to the source electrode SE and the drain electrode DE, may be source and drain regions doped or injected with an impurity, and a region between the source region and the drain region may be a channel region. Here, the oxide semiconductor may include at least one of Zn, In, Ga, Sn, and any mixture thereof. For example, the oxide semiconductor may include indium-gallium-zinc oxide (IGZO).

Meanwhile, the semiconductor layer SCL includes an oxide semiconductor, a light blocking layer (not shown) for blocking light introduced into the semiconductor layer SCL may be provided on the top and bottom of the semiconductor layer SCL.

A buffer layer BFL may be disposed between the semiconductor layer SCL and the substrate SUB. The buffer layer BFL may be an inorganic insulating layer made of an inorganic material. For example, the buffer layer BFL may be formed of silicon nitride, silicon oxide, silicon oxynitride, etc. The buffer layer BFL may be omitted in other embodiments based on material and process conditions. The buffer layer BFL may prevent an impurity from being diffused into the switching transistor Ts and the driving transistor Td from the substrate SUB. Also, the buffer layer BFL may prevent moisture and oxygen from penetrating into the display element OLED from the outside of the display panel DPN. The buffer layer BFL may planarize a surface of the substrate SUB.

A gate insulating layer GI that insulates the semiconductor layer SCL and the gate electrode GE from each other by covering the semiconductor layer SCL may be provided on the semiconductor layer SCL and the substrate SUB. The gate insulating layer GI may include at least an inorganic insulating layer. The inorganic insulating layer may include at least one of polysiloxane, silicon nitride, silicon oxide, silicon oxynitride, and equivalents thereof.

The gate line GL extending in one direction may be provided on the gate insulating layer GI. A portion of the gate line GL may be the gate electrode GE that extends to the pixel to overlap with the channel region of the semiconductor layer SCL.

An interlayer insulating layer ILD may be disposed on the gate insulating layer GI and the gate electrode GE. That is, the interlayer insulating layer ILD may cover the gate electrode GE. Like the gate insulating layer GI, the interlayer insulating layer ILD may include at least one of silicon oxide and silicon nitride. Also, the interlayer insulating layer ILD may expose portions of the source region and the drain region of the semiconductor layer SCL.

The data line DL, the power supply line VL, the source electrode SE, and the drain electrode DE, which intersect the gate line GL while being insulated from the gate line GL, may be disposed on the interlayer insulating layer ILD.

The source electrode SE and the drain electrode DE may be insulated from the gate electrode GE by the interlayer insulating layer ILD. Also, the source electrode SE and the drain electrode DE may be connected to the source region and the drain region, respectively.

Meanwhile, in this embodiment, a case where both of the driving transistor Td and the switching transistor Ts are thin film transistors having a top-gate structure is illustrated as an example, but the present disclosure is not limited thereto. For example, at least one of the driving transistor Td and the switching transistor Ts may be a thin film transistor having a bottom-gate structure.

The capacitor Cst may include a first capacitor electrode C1 and a second capacitor electrode C2. The first capacitor electrode C1 may be made of the same material as the gate line GL and the gate electrode GE, and be disposed in the same layer as the gate line GL and the gate electrode GE. That is, the first capacitor electrode C1 may be disposed on the gate insulating layer GI. The second capacitor electrode C2 may be made of the same material as the data line DL, the power supply line VL, the source electrode SE, and the drain electrode DE, and be disposed in the same layer as the data line DL, the power supply line VL, the source electrode SE, and the drain electrode DE.

A planarization layer PAS may be provided on the substrate SUB on which the switching transistor Ts, the driving transistor Td, and the capacitor Cst are disposed. That is, the planarization layer PAS may cover the switching transistor Ts, the driving transistor Td, and the capacitor Cst. Also, the planarization layer PAS may expose a portion of the drain electrode DE of the driving transistor Td.

The planarization layer PAS may include at least one layer. For example, the planarization layer PAS may include an inorganic insulating layer and an organic insulating layer disposed on the inorganic insulating layer. The inorganic insulating layer may include at least one of silicon oxide and silicon nitride. In addition, the organic insulating layer may include an organic insulating material that enables light to be transmitted therethrough. For example, the organic insulating layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

The display element OLED connected to the drain electrode DE of the driving transistor Td may be disposed on the planarization layer PAS. The display element OLED may be any one of a liquid crystal display element (LCD element), an electrophoretic display element (EPD element), an electrowetting display device (EWD element), and an organic light emitting display element (OLED element). Meanwhile, hereinafter, a case where the OLED element is used as the display element OLED is described as an example for convenience of illustration.

The display element OLED may include a first electrode AD connected to the drain electrode DE of the driving transistor Td, an emitting layer EML disposed on the first electrode AD, and a second electrode CD on the emitting layer EML.

One of the first electrode AD and the second electrode CD may be an anode electrode, and the other of the first electrode AD and the second electrode CD may be a cathode electrode. For example, the first electrode AD may an anode electrode, and the second electrode CD may be a cathode electrode.

In addition, at least one of the first electrode AD and the second electrode CD may be a transmissive electrode. For example, when the display element OLED is a bottom-emission type organic light emitting device, the first electrode AD may be a transmissive electrode, and the second electrode CD is a reflective electrode. When the display element OLED is a top-emission type organic light emitting device, the first electrode AD may be a reflective electrode, and the second electrode CD may be a transmissive electrode. When the display element OLED is a dual-emission type organic light emitting device, both of the first electrode AD and the second electrode CD may be transmissive electrodes.

An encapsulation layer SML covering the second electrode CD may be provided over the display element OLED. The encapsulation layer SML may prevent oxygen and moisture from penetrating into the display element OLED. The encapsulation layer SML may include a plurality of inorganic layers (not shown) and a plurality of organic layers (not shown). For example, the encapsulation layer SML may include a plurality unit encapsulation layers including the inorganic layer and the organic layer disposed on the inorganic layer. The inorganic layer may be disposed at the uppermost portion of the encapsulation layer SML. The inorganic layer may include at least one of silicon oxide, silicon nitride, silicon oxynitride, aluminum oxide, titanium oxide, zirconium oxide, and tin oxide.

Meanwhile, in this embodiment, a structure in which each of the pixels includes two transistors Ts and Td, one capacitor Cst, and one display element OLED is described as an example, but the present disclosure is not limited thereto. For example, each of the pixels may include six transistors and one capacitor, or include seven transistors and one capacitor. Also, each of the pixels may include a plurality of display elements.

The touch sensor TSP may be provided on the encapsulation layer SML. The touch sensor TSP may be a self-capacitance touch sensor or a mutual capacitance touch sensor according to the touch sensing form thereof.

The touch sensor TSP may include a plurality of touch electrodes TSE provided on the encapsulation layer SML, a first protective layer PSV1 covering the touch electrodes TSE, and a second protective layer PSV2 provided on the first protective layer PSV1.

When the touch sensor TSP is a self-capacitance touch sensor, the touch electrodes TSE may be arranged in a matrix form. Also, when the touch sensor TSP is a mutual capacitance touch sensor, some of the touch electrodes TSE may constitute a plurality of touch electrode rows that are connected in one direction and are parallel to one another. In addition, the others of the touch electrodes TSE may constitute a plurality of touch electrode columns that are connected in a direction intersecting the touch electrode rows and are parallel to one another.

The first protective layer PSV1 may prevent the touch electrodes TSE from being exposed to the outside. The first protective layer PSV1 may serve as a window cover of the display device.

At least one of the touch electrodes TSE may sense a fingerprint of a user while sensing a touch of the user. For example, one of the touch electrodes TSE may be implemented as the fingerprint sensor shown in FIGS. 1 to 9. That is, the touch electrode TSE implemented as the fingerprint sensor may include a plurality of sensing electrodes FSE arranged in a matrix form.

In addition, the touch sensor TSP may further include a ground electrode GND provided on the first protective layer PSV1, corresponding to the touch electrode TSE implemented as the fingerprint sensor. The ground electrode GND may include a plurality of first lines GND1 that extend in one direction and are parallel to one another and a plurality of second lines GND2 that extend in a direction intersecting the first lines GND1 and are parallel to one another. The ground electrode GND may prevent or reduce a blur phenomenon of the fingerprint sensor. Thus, the fingerprint sensing performance of the touch sensor TSP including the fingerprint sensor may be improved.

The second protective layer PSV2 may protect the ground electrode GND by covering the ground electrode GND. Also, the second protective layer PSV2 may serve as a hard coating layer capable of protecting a surface of the display device.

According to the present disclosure, the fingerprint sensor may have improved fingerprint sensing performance. Further, the touch sensor having the fingerprint sensor may sense a touch input of a user and simultaneously recognize the fingerprint of a finger of the user.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A fingerprint sensor comprising:
a plurality of sensing electrodes provided on one surface of a base substrate and arranged in a matrix form; and
a ground electrode provided on an other surface of the base substrate,
wherein the ground electrode includes:
a plurality of first lines extending in one direction and parallel to one another; and
a plurality of second lines extending in a direction intersecting the first lines, the plurality of second lines being parallel to one another,
wherein, in a plan view, the first lines and the second lines are provided between adjacent sensing electrodes, and
wherein the ground electrode is configured to make even electric force lines between ridge regions and valley regions of a detected fingerprint.

2. The fingerprint sensor of claim 1, wherein, in a plan view, the sensing electrodes are respectively provided in regions formed by the first lines and the second lines intersecting with each other.

3. The fingerprint sensor of claim 1, further comprising a protective layer covering the ground electrode.

4. The fingerprint sensor of claim 1, wherein the other surface of the base substrate faces a direction for receiving a fingerprint of a user.

5. A touch sensor comprising:
a plurality of touch electrodes provided on one surface of a base substrate; and
a ground electrode provided on an other surface of the base substrate, corresponding to one of the touch electrodes, the ground electrode including a plurality of first lines and a plurality of second lines that intersect each other,
wherein a touch electrode corresponding to the ground electrode includes a plurality of sensing electrodes arranged in a matrix form,
wherein, in a plan view, the first lines and the second lines are provided between adjacent sensing electrodes, and
wherein the ground electrode is configured to make even electric force lines between ridge regions and valley regions of a detected fingerprint.

6. The touch sensor of claim 5, wherein, in a plan view, the sensing electrodes are respectively provided in regions formed by the first lines and the second lines intersecting with each other.

7. The touch sensor of claim 5, further comprising a protective layer covering the ground electrode.

8. The touch sensor of claim 5, wherein the other surface of the base substrate faces a direction for receiving a fingerprint of a user.

9. A display device comprising:
a display panel; and
a touch sensor provided on the display panel,
wherein the touch sensor includes:
a plurality of touch electrodes provided on the display panel;

a first protective layer provided over the touch electrodes; and a ground electrode provided on the first protective layer, corresponding to one of the touch electrodes, the ground electrode including a plurality of first lines and a plurality of second lines that intersect each other, wherein a touch electrode corresponding to the ground electrode includes a plurality of sensing electrodes arranged in a matrix form, wherein, in a plan view, the first lines and the second lines are provided between adjacent sensing electrodes, and wherein the ground electrode is configured to make even electric force lines between ridge regions and valley regions of a detected fingerprint.

10. The display device of claim 9, wherein the display panel includes:

a display element provided on a substrate; and an encapsulation layer covering the display element, wherein the touch electrodes and the sensing electrodes are provided on the encapsulation layer.

11. The display device of claim 10, wherein the sensing electrodes are respectively provided in regions formed by the first lines and the second lines intersecting with each other.

12. The display device of claim 10, further comprising a second protective layer covering the ground electrode.

13. The display device of claim 12, wherein the first protective layer comprises a window cover of the display device, and the second protective layer comprises a hard coating layer protecting a surface of the display device.

14. The fingerprint sensor of claim 1, wherein the ground electrode is electrically grounded.

15. The touch sensor of claim 5, wherein the ground electrode is electrically grounded.

16. The display device of claim 10, wherein the ground electrode is electrically grounded.

* * * * *